United States Patent [19]

Carome

[11] Patent Number: 5,087,810
[45] Date of Patent: Feb. 11, 1992

[54] FIBER OPTIC MAGNETIC FIELD SENSOR

[75] Inventor: Edward F. Carome, Cleveland, Ohio

[73] Assignee: Edjewise Sensor Products, Inc., Cleveland, Ohio

[21] Appl. No.: 599,010

[22] Filed: Oct. 17, 1990

[51] Int. Cl.⁵ .............................. H01J 5/16
[52] U.S. Cl. .................. 250/227.21; 324/96
[58] Field of Search .......... 250/227.21, 231.1, 227.11; 324/96; 73/516 R, 517 R, 800, 705

[56] References Cited

U.S. PATENT DOCUMENTS

| | | | |
|---|---|---|---|
| 3,146,057 | 8/1964 | Rona | 346/108 |
| 3,449,587 | 6/1969 | Barnes | 250/227 |
| 4,239,963 | 12/1980 | August et al. | 250/231 |
| 4,249,076 | 2/1981 | Bergstrom et al. | 250/227 |
| 4,275,296 | 6/1981 | Adolfsson | 250/227 |
| 4,345,482 | 8/1982 | Adolfsson et al. | 73/862.59 |
| 4,353,259 | 10/1982 | Schneider, Jr. | 73/653 |
| 4,376,390 | 3/1983 | Rines | 73/517 |
| 4,403,144 | 9/1983 | Strahan | 250/231 |
| 4,498,004 | 2/1985 | Adolfsson et al. | 250/227 |
| 4,547,729 | 10/1985 | Adolfsson et al. | 324/96 |
| 4,829,821 | 5/1989 | Carome | 73/516 |
| 4,950,887 | 8/1990 | Hughes et al. | 250/227.21 |

OTHER PUBLICATIONS

An Introduction to Fiberoptic Sensors by C. Davis, Fiberoptic Technology, Feb. 1982, pp. 112-115.
Sensing with Optical Fibers: An Emerging Technology by A. Tebo, Electro-Optical System Design, Feb. 1982, pp. 39-45.

Primary Examiner—David C. Nelms
Attorney, Agent, or Firm—Fay, Sharpe, Beall, Fagan, Minnich & McKee

[57] ABSTRACT

Light from source (10) is transmitted along an optical fiber (12) to a free end (20). Light emitted from the optical fiber free end is transmitted to a target (22), such as the free end of a second optical fiber (16). An opto-electric transducer (18) provides an output that varies in accordance with the intensity of received light. Relative alignment between the optical fiber free end and the target is controlled by movement of a cantilever beam member (30). The cantilever beam member is a strip of ferromagnetic material (40) extending therealong. A second elongated ferromagnetic strip (42) is mounted closely adjacent but spaced from a free end (36) of the cantilever beam member defining a flux gap (44) therebetween. As magnetic flux flows through the ferromagnetic strips, the beam member free end is deflected in proportion to the strength of the magnetic field.

19 Claims, 1 Drawing Sheet

FIBER OPTIC MAGNETIC FIELD SENSOR

BACKGROUND OF THE INVENTION

The present invention relates to sensors for sensing electromagnetic conditions. The present invention finds particular application in conjunction with a sensor for sensing the magnitude of magnetic fields. However, the present invention will find other applications including sensing electrical currents by sensing magnetic fields associated therewith, sensing the presence or absence of magnetic fields, the polarity of magnetic fields, and the like.

Heretofore, a variety of electromechanical and electromagnetic field sensors have been utilized to sense magnetic fields. However, such sensors are subject to electrical interference. Electromechanical and electromagnetic sensors which are sensitive to very small magnetic field or magnetic field changes need to be shielded from their own associated electronics. Conversely, the electrical conductors and mechanical mechanisms of the sensors tend to distort the sensed magnetic field.

Fiber optic magnetic field sensors overcome the interference problems of electromechanical and electromagnetic field sensors. One type of fiber optic magnetic field sensor takes advantage of magnetic field dependent polarization properties of certain glasses. Specifically, the polarization of light passing through an optical fiber changes with the strength of the magnetic field. By measuring the amount of rotation of the light polarization, the strength of the magnetic field can be determined. Although these fiber optic magnetic field sensors are more sensitive than electromechanical and electromagnetic sensors and overcome the electrical interference problems, they are significantly more expensive.

The present invention contemplates a new and improved fiber optic sensor that overcomes the above-referenced problems yet is relatively inexpensive to manufacture.

SUMMARY OF THE INVENTION

In accordance with the present invention, a fiber optic magnetic field sensor is provided. A beam member that defines a magnetic flux conductive path therealong is mounted at a first or fixed end and extends to a second or free end. A second magnetic flux path is defined adjacent but displaced from the first magnetic flux path such that magnetic flux flowing through the first and second magnetic flux paths and a flux gap therebetween urges the beam free end to move. An optic fiber having a free end from which light is transmitted and a target means are mounted one to the beam free end and the other to an associated structure facing each other. In this manner, an amount of light transmitted between the optic fiber free end and the light receiving means varies as the beam member moves in accordance with the strength of a sensed magnetic field.

In accordance with a more limited aspect of the present invention, the target means is an end of a second length of optical fiber. Light flows from a light source through one of the optical fibers across the gap and through the other fiber to an opto-electrical transducer which produces an output signal in accordance with the intensity of received light. As the terminal ends of the two optical fibers move out of alignment, the sensed light intensity diminishes or terminates.

In accordance with another aspect of the present invention, the target means is a mirror which reflects light back to the optical fiber terminal end. An intensity detector is connected with the optical fiber to measure the changes and the relative intensity of the reflected light attributable to changes in light communication between the optical fiber and the mirror caused by magnetic field induced bending of the beam member.

In accordance with another aspect of the present invention, the second associated structure is a free end of a second beam member. The first and second beam members are constructed such that the beams move in opposite directions in response to the sensed magnetic field and move in the same direction in response to extraneous forces, such as vibration, temperature changes, and the like.

One advantage of the present invention resides in its simplicity of manufacture.

Another advantage of the present invention is that it is amenable to automated, mass-manufacturing techniques.

Another advantage of the present invention is that it accurately measures magnetic fields.

Still further advantages of the present invention will become apparent upon reading and understanding the following detailed description.

BRIEF DESCRIPTION OF THE DRAWINGS

The invention may take form in various parts and arrangements of parts, or in various steps and arrangements of steps. The drawings are only for purposes of illustrating a preferred embodiment and are not to be construed as limiting the invention.

DETAILED DESCRIPTION OF THE PREFERRED EMBODIMENT

Figure 1:
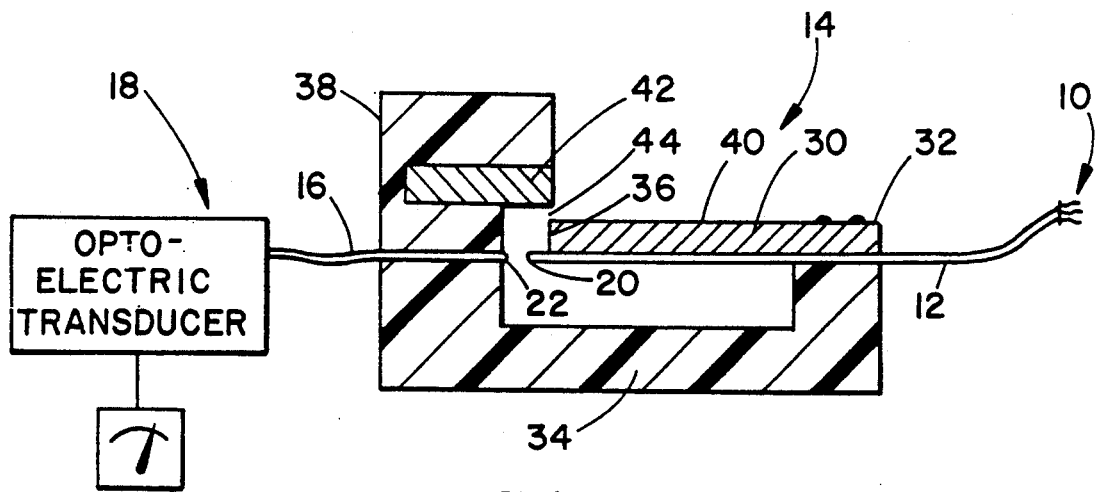
FIG. 1 is a diagrammatic illustration in partial section of an optical fiber magnetic field sensor system.

With reference to FIG. 1, light from a source of illumination 10 travels through an optical conductor, particularly an optical fiber 12 to an electromagnetic field sensor 14. The sensor modulates the light in accordance with a sensed electromagnetic field. Light exiting the magnetic field sensor is conveyed along an optic fiber 16 to an opto-electric transducer 18. The opto-electric transducer produces an output signal that varies in accordance with the intensity of received light.

The sensor 14 includes a light transfer means for transferring light between a light emitting means such as an optic fiber end 20 and a target means 22 in which the light transfer characteristics are altered in accordance with relative alignment/misalignment of the light and target means. In the embodiment of FIG. 1, the target means is an end of the second optical fiber 16 which is disposed generally opposite to the end of the first optical fiber.

The sensor further includes a cantilevered beam member 30 which is rigidly mounted at a fixed end 32 to a base 34. The beam has a free end 36 which is disposed adjacent an associated structure 38. The beam defines a first magnetic flux path 40 therealong. In the preferred embodiment, the beam 30 is a ferromagnetic member such that the entire beam functions as the flux path.

A second magnetic flux path 42, preferably a second elongated ferromagnetic member is fixedly mounted to the base 34 or the associated structure 36. The second ferromagnetic member is mounted closely adjacent and aligned with the first ferromagnetic member such that a small flux gap 44 is defined therebetween. In the presence of a magnetic field, magnetic flux flows through the aligned first and second ferromagnetic members and the flux gap 44. The free end 36 of the cantilever beam member 30 is drawn toward the second ferromagnetic member 42. The amount of deflection of the cantilevered beam member 30 is generally proportional to the strength of the magnetic flux, hence the magnetic field that is sensed. Preferably, the first and second flux paths include amorphous, non-crystalline nickel or ferrous metal sections.

One of the light means 20 and the target means 22 is mounted to the cantilever beam free member free end 36 and the other is mounted to the associated structure 38. In the preferred embodiment, the first optic fiber 12 extends along the cantilevered beam member with its light discharging end 20 adjacent the beam free end. The target means 22 is a free end of the second optic fiber 16. In this manner, the strength of the magnetic field that is sensed causes a corresponding adjustment in the alignment of the ends of the optic fibers, hence in the amount of light transferred by the sensor and received by the opto-electric transducer 18.

The strength or stiffness of the cantilever beam member 30 is selected in accordance with the strength of the magnetic fields to be detected. Optionally, the cantilever beam member may be encased in a viscous damping elastomer to limit the response rate, vibration, and the like.

Figure 2:
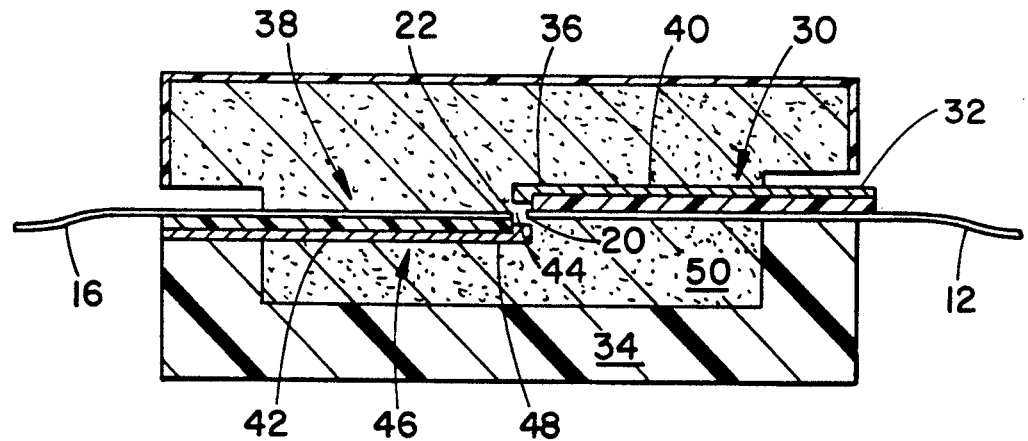
FIG. 2 is an alternate embodiment of the sensor of FIG. 1.

In the embodiment of FIG. 2, the first optic fiber again extends along the first cantilever beam member 30 to a free end 36 thereof. The free end of the first Optic fiber 12 functions as a light emitting means 20. The associated structure 38 includes a second cantilevered beam member 46. The second optic fiber 16 extends along the second cantilevered beam member and has a light receiving end or target means 22 adjacent a free end 48 thereof. The first and second flux paths 40, 42, extend along the first and second beam members 30, 46, respectively defining the flux gap 44 between adjacent ends. The flux paths and the flux gap are arranged such that the beam free ends move in opposite directions, e.g. pull together, with a force proportional to the strength of the sensed magnetic field. In this manner, the alignment of the optic fibers, hence the percentage of light transferred, varies with the field strength. As viscous elastomer or fluid 50 encases the beam members to control vibration it fills the gap between the optic fiber end 20 and the target to improve optic coupling therebetween.

Figure 3:
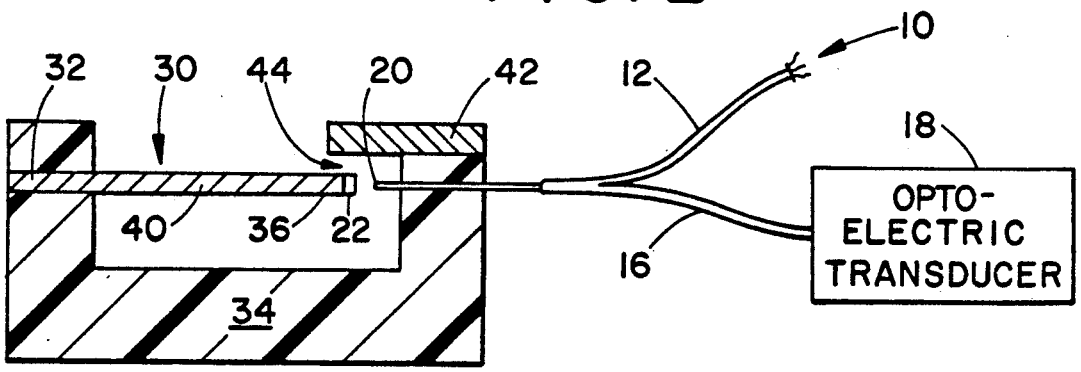
FIG. 3 is an alternate embodiment of the sensor system of FIG. 1.

In the embodiment of FIG. 3, the target means 22 is a mirror. The mirror reflects light from the light emitting free end 20 of the first optic fiber 12 back to itself. The light is conveyed through the second optic fiber 16 to the opto-electric transducer 18 which measures the intensity. In the embodiment of FIG. 3, the target mirror 22 is mounted adjacent the free end 36 of the cantilevered beam member 30. The cantilevered beam member 30 again defines a first magnetic flux path 40 therealong in longitudinal alignment with a second magnetic flux path 42. The stronger the magnetic flux flowing through the flux paths, the more the free end 36 of the beam member is deflected, hence the less light the mirror 22 reflects back to the optic fiber end 20. In this manner, the intensity of light detected by the opto-electrical detector 18 varies in accordance with the magnetic field strength.

The invention has been described with reference to the preferred embodiments. Obviously, modifications and alterations will occur others upon reading and understanding the preceding detailed description. For example, the sensor can sense electric currents by sensing their associated magnetic fields. As another example, the sensor can have only two states (optically conductive and optically non-conductive) such that its output indicates the presence or absence of a magnetic field over a selected threshold. As another alternative, the sensor can sense proximity of an associated permanent magnet or current strength through a proximally mounted coil. The sensor can also be controlled by the permanent magnet or the coil current to operate as an optical relay or an optical signal encoder or amplifier. It is intended that the invention be construed as including all such alterations and modifications insofar as they come within the scope of the appended claims or the equivalents thereof.

Having thus described the preferred embodiment, the invention is now claimed to be:

1. A magnetic field sensor comprising:
   a cantilevered beam member which is mounted at a fixed end thereof, the cantilevered beam member defining a magnetic flux path therealong generally between the fixed end and a free end thereof;
   a means for defining a second magnetic flux path, the second flux path being disposed adjacent the cantilevered beam member free end and separated from the first magnetic flux path by a magnetic flux gap, whereby when a magnetic flux flows through the first and second flux paths, the cantilevered beam member is deflected;
   a light emitting means for emitting light and a target means for receiving light emitted by a light emitting means, one of the light emitting and target means being connected with a beam member free end for movement therewith as the beam member is deflected altering an amount of light transmitted between the light emitting and target means.

2. The sensor as set forth in claim 1 wherein the second magnetic flux path defining means includes a second cantilevered member mounted generally parallel to the first cantilevered beam member, the light emitting means being mounted adjacent the free end of the first cantilevered beam member and the target means being mounted adjacent a free end of the second cantilevered beam member.

3. The sensor as set forth in claim 2 wherein the light emitting means includes a first optic fiber extending along the first beam member and the target means includes a second optic fiber extending along the second beam member, the first and second optic fibers having free ends disposed generally opposite to each other in a first plane, the first beam member being disposed to one side of the plane and the second beam member being disposed to an opposite side of the plane such that the beam members move toward each other in t he presence of a magnetic field.

4. The sensor as set forth in claim 1 wherein the target means includes a mirror.

5. A magnetic field sensor system comprising:
   a source of light;

a first optic fiber means extending from the source of light to an optical fiber terminal end;

a cantilevered beam member which is fixedly mounted at one end, the first optical fiber means extending along the beam member with the optic fiber end mounted adjacent a free end of the cantilevered beam member, the cantilevered beam member being constructed at least in part of a ferromagnetic material to define a first flux path extending therealong;

a target means fixedly mounted generally opposite the optical fiber end;

an elongated strip of ferromagnetic material which defines a second flux path having one end disposed adjacent the cantilevered beam member free end and displaced therefrom by a flux gap such that magnetic flux flowing through the first and second flux paths deflects the free end of the first beam member changing an alignment of the optical fiber end and the target means.

6. The sensor system as set forth in claim 5 wherein the target means includes an end of a second length of optical fiber which is optically connected with an opto-electric transducer means which produces an output signal in accordance with an intensity of received light.

7. The system as set forth in claim 6 further including a second cantilevered beam having a fixed end and a free end, the second optical fiber free end being mounted adjacent the second beam free end.

8. The system as set forth in claim 7 wherein the first and second beam members are constructed at least in part of a ferromagnetic material extending the length thereof to define the first and second flux paths.

9. The system as set forth in claim 8 wherein the ferromagnetic material is an amorphous, non-crystalline metal.

10. The system as set forth in claim 6 wherein the second flux path ferromagnetic strip is fixedly mounted relative to the beam member fixed end.

11. The system as set forth in claim 5 wherein the target means and the second flux path ferromagnetic strip are fixedly mounted relative to the beam member fixed end.

12. The system as set forth in claim 11 wherein the ferromagnetic material is an amorphous, non-crystalline metal.

13. The system as set forth in claim 5 wherein the target means includes a mirror which reflects light from the optical fiber end back to the optic fiber end and further including an opto-electrical transducer operatively connected with the fiber optic means for sensing variations in intensity attributable to changes in an amount of light reflected by the mirror.

14. The system as set forth in claim 13 wherein the beam member is constructed at least in part of a ferromagnetic material extending the length thereof.

15. The system as set forth in claim 14 wherein the ferromagnetic material is an amorphous, non-crystalline metal.

16. A sensor comprising:
a light transfer means for selectively transferring light received from a light source;
a cantilever beam member connected to the light transfer means for controlling the light transfer in accordance with movement thereof;
a first flux path connected with the beam member and a second flux path displaced from the first flux path by a flux gap such that the first and second flux paths pull together across the gap in accordance with magnetic flux therethrough cause the beam member to move in accordance with the magnetic flux through flux paths, whereby the light is transferred in accordance with the magnetic flux.

17. The sensor as set forth in claim 16 further including:
an optical fiber means for conveying light from the light source to the transfer means and from the transfer means to a light intensity detecting transducer.

18. The sensor as set forth in claim 17 further including a viscous fluid encasing the beam member to control vibration thereof.

19. The sensor as set forth in claim 18 wherein the light transfer means includes a free end of the optic fiber means and a target with a space therebetween and the viscous fluid is an optic coupling fluid which fills space between the optic fiber means and the target to improve light transfer therebetween.

* * * * *